(12) United States Patent
Kugiyama

(10) Patent No.: US 9,553,212 B2
(45) Date of Patent: Jan. 24, 2017

(54) OPTICAL COUPLER

(71) Applicant: KABUSHIKI KAISHA TOSHIBA, Tokyo (JP)

(72) Inventor: Yuta Kugiyama, Buzen Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 14/634,329

(22) Filed: Feb. 27, 2015

(65) Prior Publication Data

US 2016/0043809 A1  Feb. 11, 2016

(30) Foreign Application Priority Data

Aug. 8, 2014 (JP) .................................. 2014-162336

(51) Int. Cl.
*G02B 27/00* (2006.01)
*H01L 31/00* (2006.01)

(52) U.S. Cl.
CPC ...................................... *H01L 31/00* (2013.01)

(58) Field of Classification Search
CPC ................... H01L 31/00; H01L 31/162; H01L 2224/48247; H04B 10/802
USPC ........................................................ 250/551
See application file for complete search history.

(56) References Cited

U.S. PATENT DOCUMENTS 6,445,008 B1 *  9/2002  Lin ....................... H01L 25/167
                                                    257/100
6,905,261 B2    6/2005  Ishii et al.

FOREIGN PATENT DOCUMENTS

JP   2008198640 A   8/2008
JP   2011054626 A   3/2011

\* cited by examiner

*Primary Examiner* — Thanh Luu
(74) *Attorney, Agent, or Firm* — Patterson & Sheridan, LLP

(57) ABSTRACT

An optical coupler includes an optical transmitting unit and an optical receiving unit in a facing arrangement. The optical transmitting unit includes a power lead having a first die-pad portion, a light emitting element on the first die-pad portion, a ground lead having a second die-pad portion, and an integrated circuit on the second die-pad portion. The integrated circuit has a power pad portion, a light emitting element pad portion, and input pad portions thereon. An inter-center distance between an inner lead of the first input lead and an inner lead of the second input lead is equal to or less than an inter-center distance between an outer lead of the first input lead and an outer lead of the second input lead.

20 Claims, 9 Drawing Sheets

OPTICAL COUPLER

CROSS-REFERENCE TO RELATED APPLICATION

This application is based upon and claims the benefit of priority from Japanese Patent Application No. 2014-162336, filed Aug. 8, 2014, the entire contents of which are incorporated herein by reference.

FIELD

Embodiments described herein relate generally to an optical coupler.

BACKGROUND

An optically coupled isolation device, which includes an optical transmitting unit with an analog-digital conversion circuit and an optical receiving unit, may transmit a signal in a state where an input terminal and an output terminal are insulated from each other.

A drastic current variation in an analog-digital conversion circuit and the like generates a noise voltage through electromagnetic induction. The noise voltage is input into a circuit through, for example, capacitive coupling caused by parasitic capacitance between leads or magnetic coupling between leads.

In some circumstances, the isolation device may fail when the noise voltage increases.

DETAILED DESCRIPTION

An embodiment provides an optical coupler with improved resistance to noise signals.

In an embodiment, an optical coupler includes an optical transmitting unit that comprises: a first die-pad portion on a power lead, a light emitting element on the first die-pad portion, a second die-pad portion on a ground lead, a first input lead between the power lead and the ground lead, a second input lead between the power lead and the ground lead, and an integrated circuit. The integrated circuit is on the second die-pad portion and has a power pad portion, a light emitting element pad portion, a first input pad portion, and a second input pad portion thereon. The pad portions are for making input/output connections to the integrated circuit. The optical coupled isolation device also includes an optical receiving unit that is in a facing arrangement with the optical transmitting unit. The power lead, the first input lead, the second input lead, and the ground lead each have an outer lead portion and an inner lead portion. Here, the inner lead portions are within a resin encapsulating the optical transmitting unit and the optical receiving unit. The outer lead portions are the lead portions extending in a first direction from the resin. The outer lead portions are spaced apart from each other in a second direction crossing the first direction. An inter-center distance between the inner lead portion of the first input lead and the inner lead portion of the second input lead in the second direction is equal to or less than an inter-center distance between the outer lead portion of the first input lead and the outer lead of portion the second input lead in the second direction. Here, an "inter-center" distance refers to distances between centerlines of the respective leads, such as, for example depicted in FIG. 2B.

Hereinafter, exemplary embodiments will be described with reference to the accompanying drawings.

Figure 1:
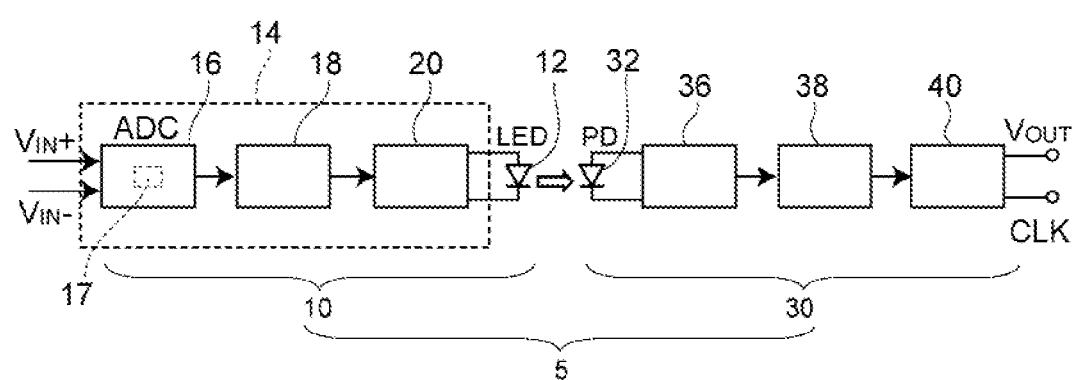
FIG. 1 is a block diagram of an optical coupler according to a first embodiment.

FIG. 1 is a block diagram of an optical coupler according to a first embodiment.

The optical coupler (optically coupled isolation device) 5 includes an optical transmitting unit 10 and an optical receiving unit 30.

The optical transmitting unit 10 includes a light emitting element 12 and a semiconductor element such as, for example, driving IC (integrated circuit) 14 which drives the light emitting element 12.

The optical transmitting unit 10 may include, for example, an encoding circuit 18 and a driving circuit 20 for the light emitting element 12 and be formed in one chip. The driving IC 14 includes an analog-digital conversion circuit 16 with a clock generator 17. Power (contact) pads, a light emitting contact pad (or pads) and signal input pads are disposed on an upper surface of the driving IC 14. The analog-digital conversion circuit 16 may be, for example, a ΔΣ ADC (delta-sigma type analog-digital conversion circuit).

The optical receiving unit 30 may include a light receiving element 32, a photoelectric conversion circuit 36, a decoding circuit 38, and an output buffer 40, for example. The optical receiving unit 30 may be formed in one chip. The optical receiving unit 30 receives light emitted by the light emitting element 12 and converts the received light into an electric signal.

Figure 2A:
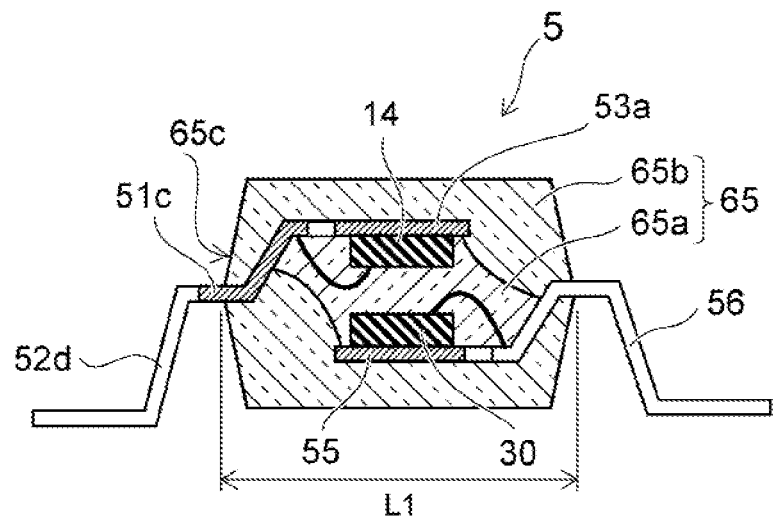
FIG. 2A is a schematic cross-sectional view of the optical coupler according to the first embodiment.
Figure 2B:
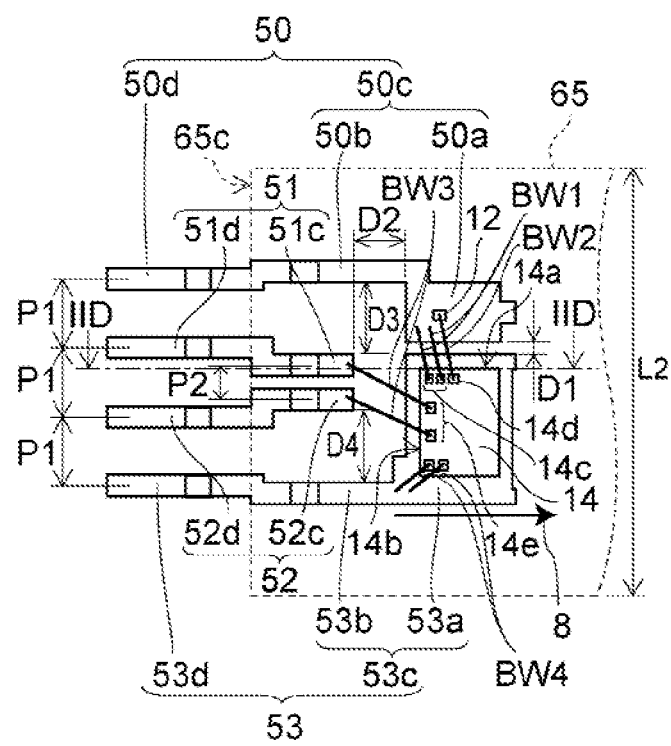
FIG. 2B is a schematic bottom view of an optical transmitting unit according to the first embodiment.
Figure 2C:
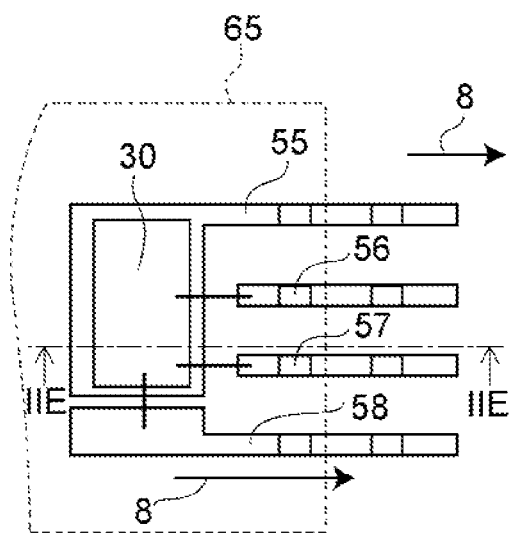
FIG. 2C is a schematic top view of an optical receiving unit according to the first embodiment.
Figure 2D:
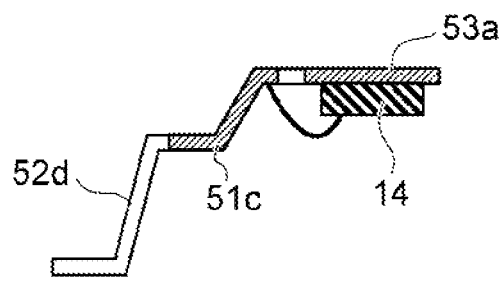
FIG. 2D is a schematic cross-sectional view of the optical transmitting unit in FIG. 2B.
Figure 2E:
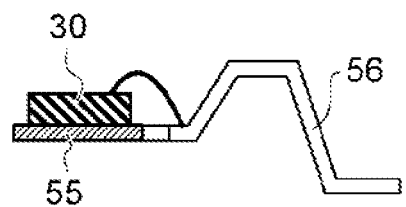
FIG. 2E is a schematic cross-sectional view of the optical receiving unit of FIG. 2C.

FIG. 2A is a schematic cross-sectional view of the optical coupler according to the first embodiment. FIG. 2B is a schematic bottom view of the optical transmitting unit according to the first embodiment. FIG. 2C is a schematic top view of the optical receiving unit according to the first embodiment. FIG. 2D is a schematic cross-sectional view of the optical transmitting unit taken along line IID-IID of FIG. 2B. FIG. 2E is a schematic cross-sectional view of the optical receiving unit taken along line IIE-IIE of FIG. 2C.

The optical transmitting unit 10 includes a power lead 50, a light emitting element 12, a first input lead 51, a second input lead 52, a ground lead 53, and a driving IC 14. The power lead 50 includes a first die-pad portion 50a, the light emitting element 12 is disposed at the first die-pad portion 50a, the first input lead 51 receives an analog differential signal VIN+, the second input lead 52 receives an analog differential signal VIN-, the ground lead 53 has a second die-pad portion 53a, and the driving IC 14 is disposed at the second die-pad portion 53a and drives the light emitting element 12. The first and second input leads 51 and 52 are disposed between the power lead 50 and the ground lead 53.

The optical coupler may further include a resin-molding body 65. The power lead 50, the first input lead 51, the second input lead 52 and the ground lead 53 are sequentially disposed in one side surface 65c of the resin-molding body 65, and an outer lead (outer lead portion) 50d of the power lead 50, an outer lead (outer lead portion) 51d of the first input lead 51, an outer lead (outer lead portion) 52d of the second input lead 52 and an outer lead (outer lead portion) 53d of the ground lead 53 protrude from the resin-molding body 65 in a first direction 8. Pitches (inter-center distance) P1 between the respective outer leads 50d, 51d, 52d, and 53d are typically the same. An inter-center distance P2 between an inner lead (inner lead portion) 51c of the first input lead 51 and an inner lead (inner lead portion) 52c of the second input lead 52 is equal to or less than the pitch P1. Here, "inner lead" refers to lead portions within the resin-molding body 65.

A lead frame having, for example, a width of 0.4 mm and a thickness of 0.15 mm is formed of copper alloy or the like, and includes a Pd-plated (palladium-plated) layer or the like on the face surface of the lead frame.

The optical receiving unit 30 is connected to a ground lead 55, a second output lead 56 outputting $V_{out}$-, a first output lead 57 outputting $V_{out}$+, and a power lead 58. In the embodiment depicted in FIG. 2C, the optical receiving element is connected to the first output lead 57, the second output lead 56, and the power lead 58 via bonding wires. The optical receiving unit 30 is mounted on the ground lead 55. A type of output supplied by the output leads 56 and 57 may be digital or analog. The resin-molding body 65 seals the optical transmitting unit 10 and the optical receiving unit 30 within. The respective outer leads (outer lead portions) of the ground lead 55, the first output lead 57, the second output lead 56, and the power lead 58 are parallel to the first direction 8. The optical receiving unit 30 may also output a clock signal (CLK).

The resin-molding body 65 includes an inner resin 65a which transmits light output by the LED 12 and a lightproof (non-transmitting) outer resin 65b which is disposed outside of the inner resin 65a.

The driving IC 14 has a first side surface 14a and a second side surface 14b, the first side surface 14a extending in a direction parallel to the first direction 8, and the second side surface 14b extending in a direction orthogonal to the first direction 8, as shown in FIG. 2B. That is, in the example embodiment depicted in FIG. 2B, the first side surface 14a and the second side surface 14b meet to form a corner. Here, the first side surface 14a and the second side surface 14b refer to edge surfaces of the driving IC 14. Furthermore, while depicted in FIG. 2B as meeting to form a corner, it is not required that first side surface 14a and second side surface 14b meet to form a corner. A power pad portion 14c and a light emitting element pad portion 14d are disposed on an upper surface of the driving IC 14 proximate the first side surface 14a (e.g., near the edge of the upper surface of driving IC 14 formed by first side surface 14a). Two input pad portions 14e are disposed on the upper surface of the driving IC 14 proximate the second side surface 14b (e.g., near the edge of the upper surface of driving IC 14 formed by second side surface 14b), the two input pad portions 14e being respectively connected to the first input lead 51 and the second input lead 52.

The optical coupler 5 may be referred to as an optically coupled isolation amplifier. In specific embodiments, the optical coupler 5 may have a horizontal length L1 of 5.5 mm and a vertical length L2 of 7.5 mm.

The analog-digital conversion circuit 16 operates to switch on and off of the light emitting element 12. In this case, for example, the light emitting element 12 is driven by a spike-shaped current associated with a sampling clock, and then an internal noise is generated. The internal noise will be described below.

Figure 3:
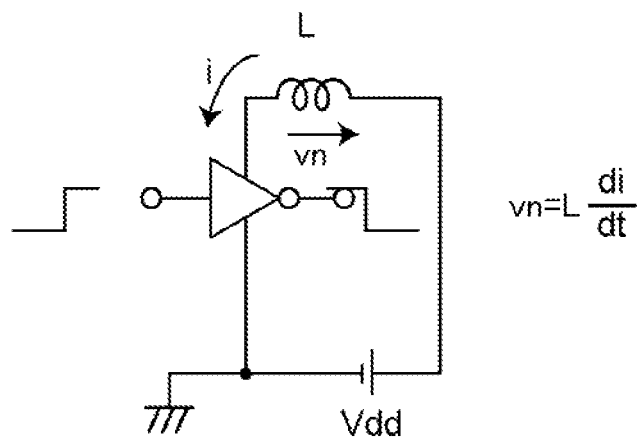
FIG. 3 is a circuit diagram for describing a noise voltage generated by an inductance of a lead.

FIG. 3 is a circuit diagram for describing a noise voltage generated by an inductance of a lead.

An internal noise, which is expressed by vn=L×(di/dt), is generated due to the electromagnetic induction corresponding to an inductance L of a lead when a current i varies drastically in a logical circuit having an inverter, as shown in FIG. 3. The internal noise, or a noise from the outside, is input to the optical transmitting unit 10 by magnetic coupling or capacitive coupling, the magnetic coupling occurring due to the lead frame and a bonding wire, which configure the optical transmitting unit 10, and the capacitive coupling occurring due to crosstalk between the leads. The inputted noise overlaps a signal inside the optical transmitting unit 10.

There is a case where the logical circuit fails if the noise voltage vn exceeds a direct-current offset voltage when the circuit of the optical transmitting unit 10 includes a MOSFET or the like. The noise voltage vn may be estimated by simulating device operation in an electromagnetic field. The simulation in the electromagnetic field is performed on an equivalent circuit having a three-dimensional structure corresponding to the optical transmitting unit 10 disposed on the lead frame.

Figure 4:
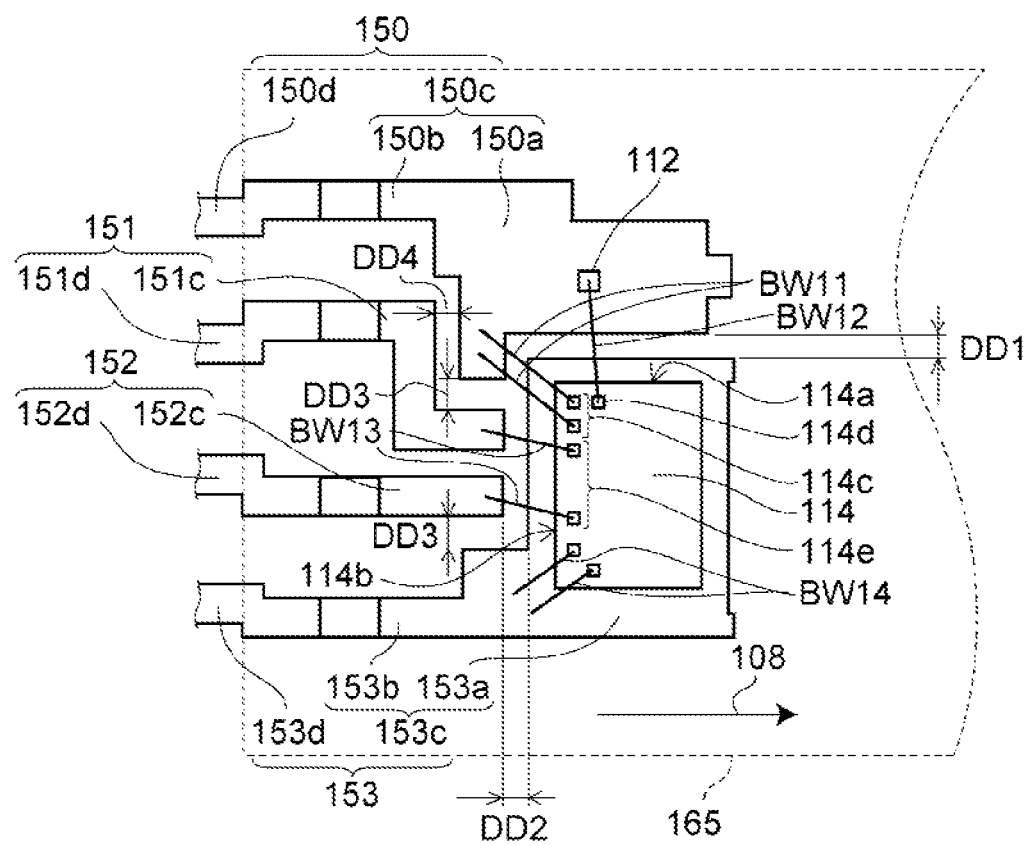
FIG. 4 is a schematic bottom view of an optical transmitting unit according to a comparative example.

FIG. 4 is a schematic bottom view of an optical transmitting unit according to a comparative example.

A first die-pad portion 150a of a power lead 150 and a second die-pad portion 153a of a ground lead 153 have a gap DD1 therebetween. The first die-pad portion 150a and the second die-pad portion 153a face each other across the gap DD1 along in parallel a first direction 108. The first die-pad portion 150a and the second die-pad portion 153a also face each other across a gap DD2 along a direction orthogonal to the first direction 108.

An inner lead (inner lead portion) 151c of a first input lead 151 includes a bent portion and is close to the first die-pad portion 150a with gaps DD3 and DD4 therebetween, for example. Accordingly, the capacitive coupling between these components is strong.

An end portion of the inner lead 151c is separated from the second die-pad portion 153a by the gap DD2. An end portion of an inner lead (inner lead portion) 152c of a second input lead 152 is separated from the second die-pad portion 153a by the gap DD2. As the gap DD2 decreases, the capacitive coupling between these components becomes stronger.

The inner lead 151c includes a bent portion, and thus the first input lead 151 has a length that is longer than that of the second input lead 152, and an inductance of the first input lead 151 correspondingly increases. Accordingly, it is not possible to remove the noise occurred between the two leads (151 & 152) to which differential signals are input, that is, between the first input lead 151 and the second input lead 152.

A bonding wire BW11 connects the power lead 150 with a driving IC 114. A bonding wire BW13 connects the first and second input leads 151 and 152 with the driving IC 114. The bonding wire BW11 and the bonding wire BW13 are disposed so as to cross over a second side surface 114b of the driving IC 114. Accordingly, an orthogonal component of the electromagnetic field decreases, the magnetic coupling becomes strong, and thus it is more likely for the noise from the power lead 150 to be input into the driving IC 114.

Figure 5:
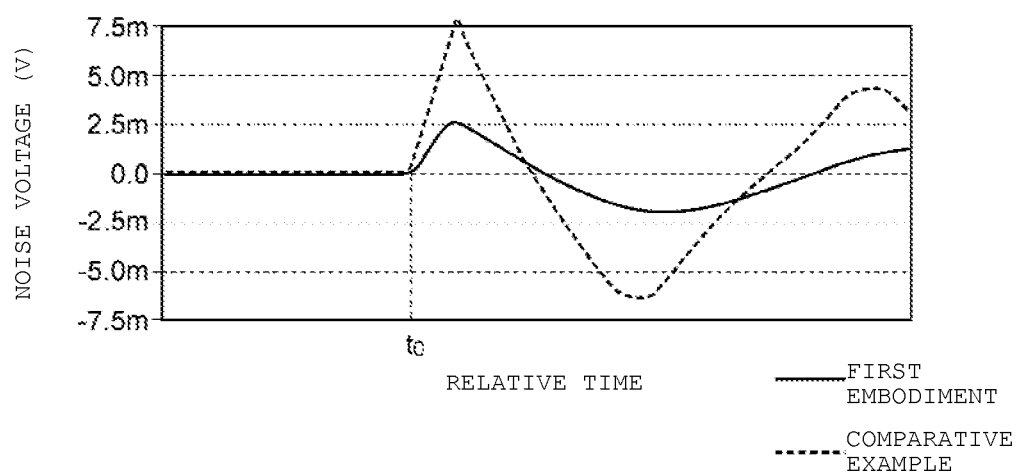
FIG. 5 is a graph obtained by simulating a noise voltage.

FIG. 5 is a graph obtained by simulating noise voltages input into optical coupling isolation devices. A vertical axis indicates a voltage (V) (noise voltage); a horizontal axis indicates a relative time after a time t0 when a pulse is applied for the first time. A dotted line indicates a noise voltage response in the comparative example. A solid line indicates a noise voltage response in the first embodiment.

The noise voltage vn attenuates with time. Rising or falling of a driving current pulse changes drastically and the noise voltage vn correspondingly increases. The first peak value of the noise voltage vn is about 7.5 mV in the comparative example after the current i rises drastically. On the other hand, the first peak value of the noise voltage vn is approximately 2.5 mV in the first embodiment.

That is, when the inner lead 51c of the first input lead 51 is equal in length to the inner lead 52c of the second input lead 52 along the first direction 8 in the first embodiment, the noise voltage is generated in the first input lead 51 and the second input lead 52 with substantially the same magnitude since the lengths of the first input lead 51 and the second input lead 52 are equal. The noise voltage generated in the first input lead 51 thus has an equal magnitude to that of the noise voltage generated in the second input lead 52. When a difference between signals which are respectively input to the first input lead 51 and the second input lead 52 is generated with the same magnitude, the input noise voltages are mutually cancelled. As a result, it is possible to reduce the influence of the noise voltage on the difference between the signals. That is, it is possible to improve noise immunity of the optical coupler.

An inter-center distance P2 is a distance between the center of the inner lead 51c and the center of the inner lead 52c, an inter-center distance P1 is a distance between the center of the outer lead 51d of the first input lead 51 and the center of the outer lead 52d of the second input lead 52, and the inter-center distance P2 is less than the inter-center distance P1. That is, a gap D3 between an extraction portion 50b of the power lead 50 and the inner lead 51c of the first input lead 51 is larger than the gap DD3 of the comparative example. That is, the capacitance of a capacitor formed between the two adjacent lead areas decreases. Accordingly, capacitive coupling may be reduced, and influence of the noise voltage resulting from the drastic current variation generated between the power lead 50 and the ground lead 53 may be reduced.

Similarly, a gap D4 between the inner lead 52c of the second input lead 52 and an extraction portion 53b of the ground lead 53 is larger than the gap DD3 of the comparative example, and it is thus possible to weaken the capacitive coupling between these portions.

A gap between an end portion of the inner lead 51c of the first input lead 51 and the second die-pad portion 53a of the ground lead 53, and a gap between an end portion of the inner lead 52c of the second input lead 52 and the second die-pad portion 53a of the ground lead 53 are a D2 and the D2 is larger than the gap DD2 of the comparative example. Accordingly, it is possible to weaken the capacitive coupling.

A bonding wire BW1 for connecting the power lead 50 with the driving IC 14 is provided to cross over the first side surface 14a of the driving IC 14. In the top-down view (e.g., FIG. 2B), the planar extension direction of bonding wire BW1 may intersect the planar extension direction of bonding wire BW3. In some embodiments, the planar extension direction of the bonding wire BW1 may be perpendicular to the planar extension direction of the bonding wire BW3. Accordingly, it is possible to weaken the magnetic coupling compared to the comparative example, which has bonding wires BW11 and BW13 both extending across gap DD2.

Furthermore, a bonding wire BW4 for connecting a ground pad portion 14f of the driving IC 14 with the ground lead 53 is disposed to have a planar extension direction that is also close to perpendicular the planar extension direction of the bonding wire BW3, and it is therefore possible to further weaken the magnetic coupling.

As above, in the first embodiment, the first input lead 51 has the same length as the second input lead 52, and then the noise voltages along the differential signal respectively generated in the first input lead 51 and the second input lead 52 may be cancelled. The gap between the first input lead 51 and the power lead 50 increases, the gap between the second input lead 52 and the ground lead 53 increases, and then it is possible to weaken the capacitive coupling, and it is possible to prevent the noise voltage due to the drastic current variation from being generated in the first input lead 51 and the second input lead 52. The bonding wire BW3 for connecting the first input lead 51 and the second input lead 52 with the driving IC 14 extends in a direction that intersects with the extending direction of the bonding wire BW1 so as to be close to orthogonal to each other, so it is possible to weaken the magnetic coupling in this manner. Accordingly, it is possible to improve the noise immunity of the optical coupler.

Figure 6A:
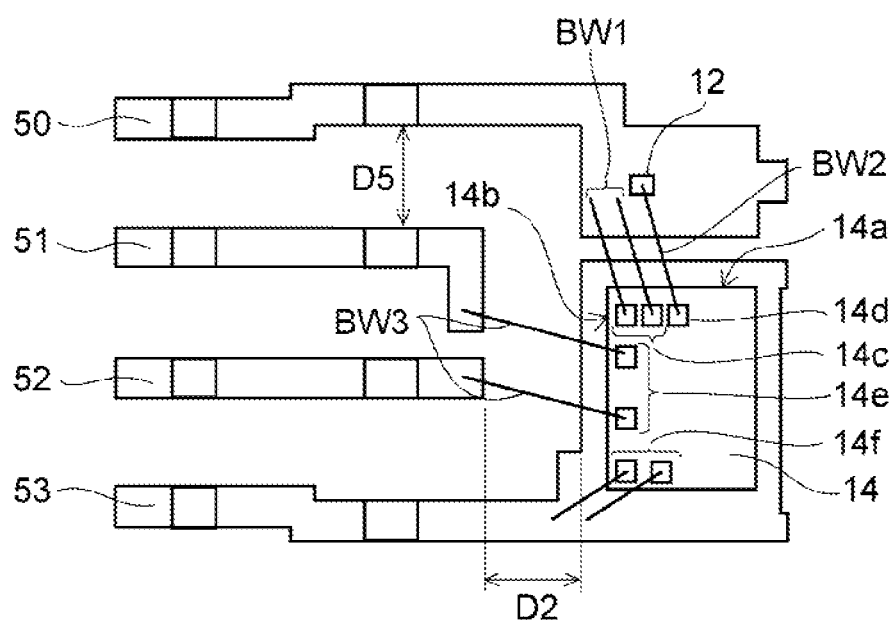
FIG. 6A is a schematic bottom view of an optical transmitting unit according to a first modification example of the first embodiment.
Figure 6B:
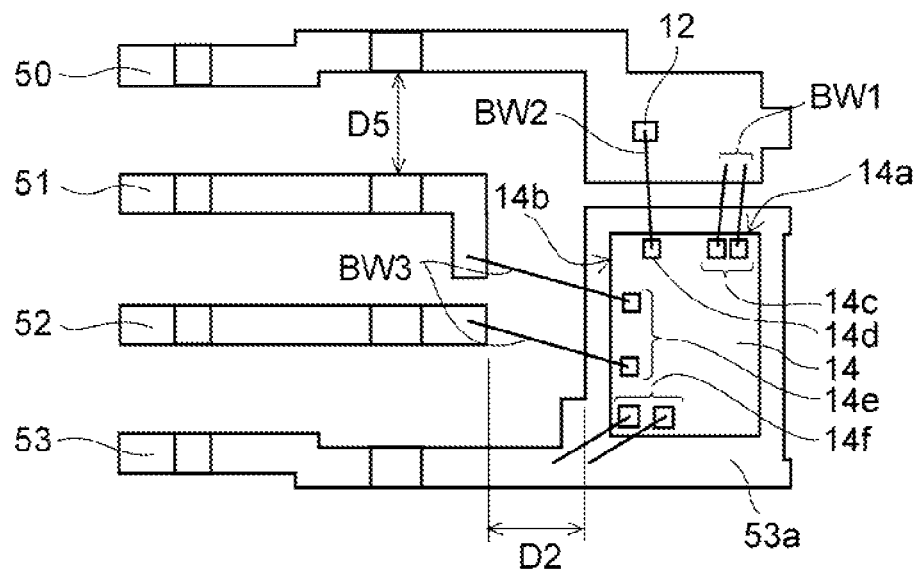
FIG. 6B is a schematic bottom view of an optical transmitting unit according to a second modification example of the first embodiment.

FIG. 6A is a schematic bottom view of an optical transmitting unit according to a first modification example of the first embodiment, and FIG. 6B is a schematic bottom view of an optical transmitting unit according to a second modification example of the first embodiment.

In the first modification example shown in FIG. 6A, the inter-center distance P2 between the inner lead 51c and the inner lead 52c is equal to a pitch P1 of the outer leads 50d to 53d.

In the second modification example shown in FIG. 6B, the bonding wire BW1 is disposed at a position separated from the bonding wire BW3 (on the outer edge side of the second die-pad portion 53a) and has a extension direction that is close orthogonal to the extension direction of the bonding wire BW3.

Figure 7:
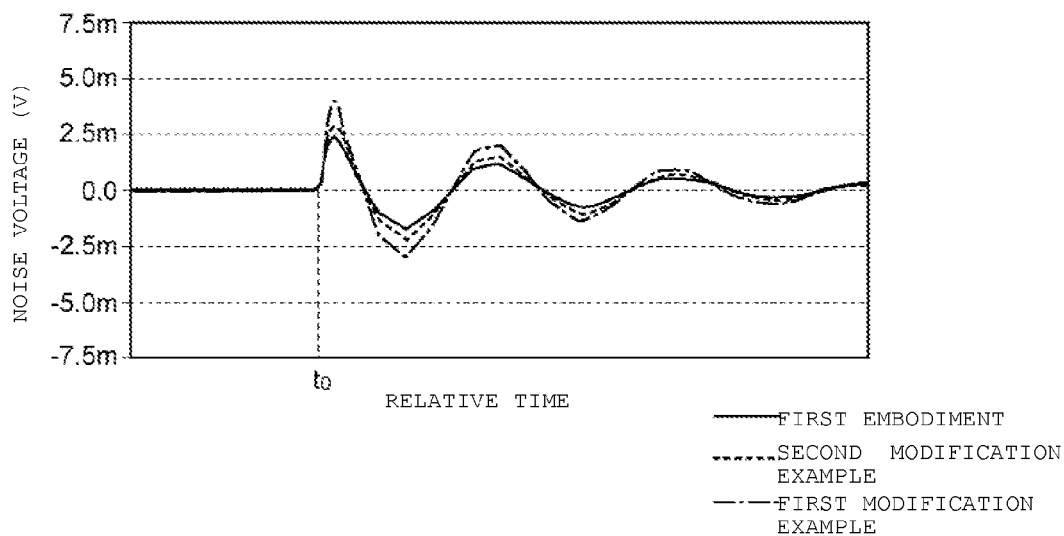
FIG. 7 is a graph of respective noise voltages in optical couplers according to the first embodiment and the first and second modification examples thereof.

FIG. 7 is a graph with the noise voltage responses of the optical couplers according to the first embodiment, the first modification example of the first embodiment, and the second modification example of the first embodiment.

In the first modification example, a gap D5 between the first input lead 51 and the power lead 50 is smaller than a gap D3 in the first embodiment, and the magnetic coupling becomes stronger than that in the first embodiment. Accordingly the noise voltage with approximately 4 mV is generated, but the noise voltage is still reduced in comparison to the noise voltage of 7.5 mV in the comparative example (see FIG. 5 for a comparative example noise voltage response).

A bonding wire BW2 for connecting the light emitting element 12 with the light emitting element pad portion 14d of the driving IC 14 may be separated from the first input lead 51 and the second input lead 52, and close to orthogonal with the first input lead 51 and the second input lead 52 in the second modification example. Accordingly, the noise voltage with approximately 2.8 mV is generated, but it is still possible for the noise voltage to be reduced in comparison to the noise voltage with 7.5 mV in the comparative example.

Figure 8A:
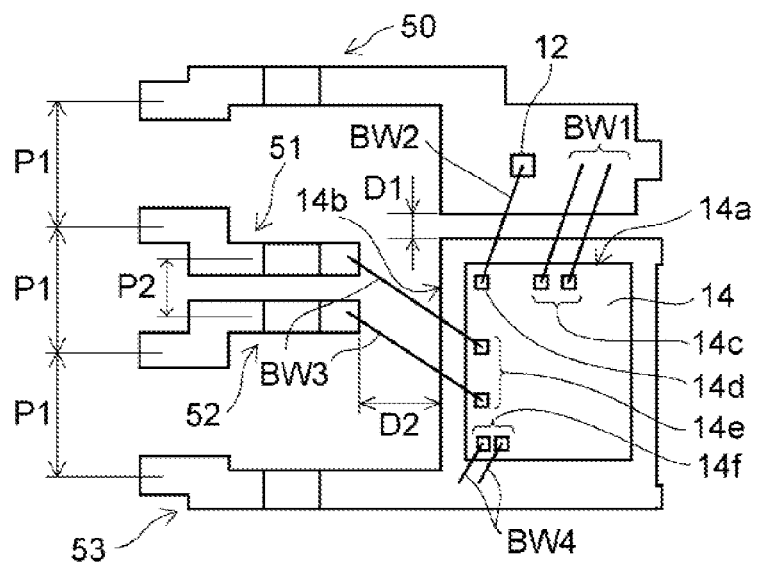
FIG. 8A is a schematic bottom view of an optical transmitting unit according to a second embodiment.
Figure 8B:
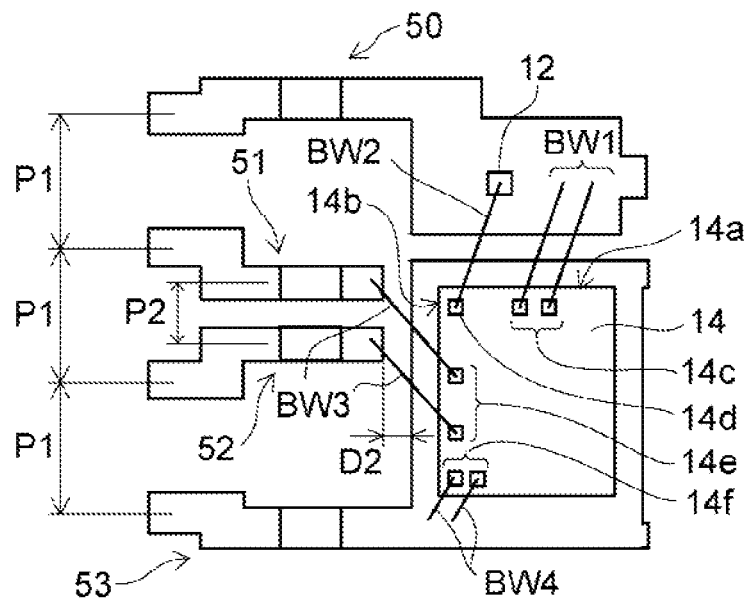
FIG. 8B is a schematic bottom view of an optical transmitting unit according to a third embodiment.
Figure 8C:
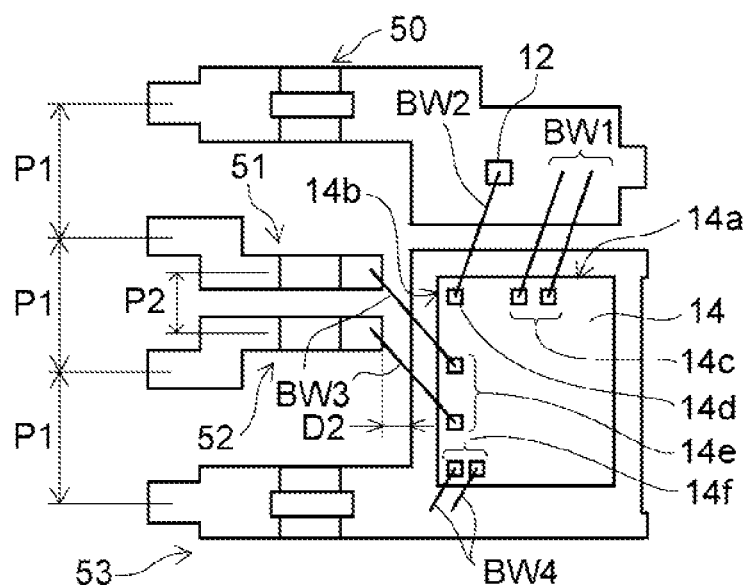
FIG. 8C is a schematic bottom view of an optical transmitting unit according to a fourth embodiment.

FIG. 8A is a schematic bottom view of an optical transmitting unit according to a second embodiment, FIG. 8B is a schematic bottom view of an optical transmitting unit according to a third embodiment, and FIG. 8C is a schematic bottom view of an optical transmitting unit according to a fourth embodiment.

The first input lead 51 and the second input lead 52 have the same length in each of the optical transmitting units 10 according to the second to fourth embodiments. Accordingly, these embodiments are likely to cancel the noise voltage due noise included in the differential signal (at same magnitudes on each input lead).

The bonding wire BW1 for connecting the power lead 50 with the power pad portion 14c of the driving IC 14 is provided to be close to orthogonal with the bonding wire BW3 for joining the first input lead 51 to the input pad portion 14e and orthogonal with the bonding wire BW3 for joining the second input lead 52 to the input pad portion 14e. Accordingly, it is possible to reduce the noise voltage due to the magnetic coupling. As depicted in FIG. 8A-C, the second through fourth embodiments have different arrangements and/or positions of the elements 50, 51, 52, and 53.

Figure 9:
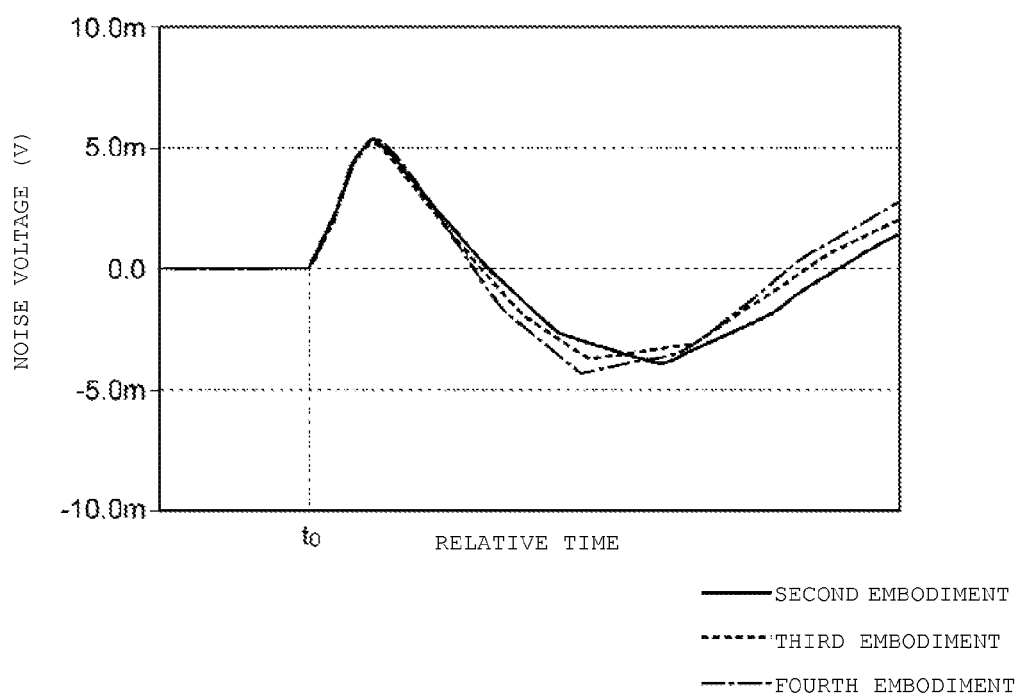
FIG. 9 is a graph of respective noise voltages in optical couplers according to the second to the fourth embodiments.

FIG. 9 is a view showing a graph with the noise voltages responses in the second to fourth embodiments.

The noise voltages in the second to fourth embodiments are equal to or less than approximately 5 mV, and it is possible for the noise voltage to be reduced in comparison to that in the comparative example. In the third and fourth embodiments (depicted in FIG. 8B and FIG. 8C, respectively), it is possible for end portions of the first input lead 51 and the second input lead 52 to be close to the power lead 50 or the ground lead 53 so as to be easily mounted in comparison to the second embodiment. In the third and fourth embodiments, the parasitic capacitance is a little larger than that in the second embodiment, but the noise voltage is equal to or less than 5.5 mV, and it is possible for the noise voltage to be reduced in comparison to the comparative example.

The noise voltage is reduced in the optical coupler according to each of the first to fourth embodiments. This helps prevent incorrect operation of the optical coupler from occurring. The optical couplers may be widely used in a control mechanism, a measurement mechanism, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupler, comprising:
an optical transmitting unit that includes:
   a first die-pad portion on a power lead,
   a light emitting element disposed on the first die-pad portion,
   a second die-pad portion on a ground lead,
   a first input lead between the power lead and the ground lead,
   a second input lead between the power lead and the ground lead, and
   an integrated circuit on the second die-pad portion and having a power pad portion, a light emitting element pad portion, a first input pad portion, and a second input pad portion thereon; and
an optical receiving unit in a facing arrangement with the optical transmitting unit,
wherein the power lead, the first input lead, the second input lead, and the ground lead each have an outer lead portion and an inner lead portion, the inner lead portions being within a resin encapsulating the optical transmitting unit and the optical receiving unit, the outer lead portions extending in a first direction from the resin and spaced apart from each other in a second direction crossing the first direction, and
an inter-center distance between the inner lead portion of the first input lead and the inner lead portion of the second input lead in the second direction is equal to or less than an inter-center distance between the outer lead portion of the first input lead and the outer lead of portion the second input lead in the second direction.

2. The optical coupler according to claim 1, wherein
the integrated circuit has a first side surface and a second side surface, the first side surface extending in the first direction and facing a side surface of the first die-pad portion, the second side surface extending in the second direction and facing an end portion of the first input lead and an end portion of the second input lead,
the power pad portion and the light emitting element pad portion are disposed along the first side surface of the integrated circuit, and
the first and second input pad portions are disposed along the second side surface of the integrated circuit.

3. The optical coupler according to claim 2, wherein
a bonding wire that connects the power lead to the integrated circuit extends across the first side surface of the integrated circuit to the power pad portion,
a bonding wire that connects the first input lead to the integrated circuit extends across the second side surface of the integrated circuit to the first input pad portion, and
a bonding wire that connects the second input lead with the integrated circuit extends across the second side surface of the integrated circuit to second input pad portion.

4. The optical coupler according to claim 3, wherein the bonding wire that connects the power lead to the integrated circuit extends in a direction approximately perpendicular to a direction in which the bonding wire that connects the first input lead to the integrated circuit extends.

5. The optical coupler according to claim 4, wherein the direction in which bonding wire that connects the first input lead to the integrated circuit extends is parallel to a direction in which the bonding wire that connects the second input lead to the integrated circuit extends.

6. The optical coupler according to claim 5, wherein the first input lead and the second input lead have a same length.

7. The optical coupler according to claim 1, wherein the first input lead and the second input lead have a same length.

8. The optical coupler according to claim 1, wherein the inter-center distance between the inner lead portion of the first input lead and the inner lead portion of the second input lead in the second direction is less than the inter-center distance between the outer lead portion of the first input lead and the outer lead portion of the second input lead in the second direction.

9. The optical coupler according to claim 1, wherein the integrated circuit includes an analog-digital conversion circuit with a clock generator.

10. An optical coupler, comprising:
an optical transmitting unit and an optical receiving unit in a facing arrangement, the optical transmitting unit and the optical receiving unit being encased in a resin package and having a plurality of leads extending from the resin package, the optical transmitting unit including:
a light emitting element on a first die-pad portion of a power lead,
a semiconductor element on a second die-pad portion on a ground lead, the first and second die-pad portions being spaced from each other in a first direction,
a first input lead between the power lead and the ground lead in the first direction,
a second input lead between the power lead and the ground lead in the first direction, the first and second input leads being spaced from each other in the first direction and spaced from the second die-pad portion in a second direction crossing the first direction, wherein
the power lead, the first input lead, the second input lead, and the ground lead each have an outer lead portion and an inner lead portion, the inner lead portions being within the resin package, the outer lead portions extending in the second direction from the resin package and spaced apart from each other in the first direction, and
a distance, along the first direction, between a centerline of the inner lead portion of the first input lead and a centerline of the inner lead portion of the second input lead is equal to or less than a distance, along the first direction, between a centerline of the outer lead portion of the first input lead and a centerline of the outer lead of portion the second input lead.

11. The optical coupler according to claim 10, wherein the integrated circuit has a power pad portion, a light emitting element pad portion, a first input pad portion, and a second input pad portion thereon,
the power pad portion being electrically connected to power lead,
the light emitting element pad portion being electrically connected to the light emitting element,
the first input pad portion being electrically connected to the first input lead, and
the second input pad portion being electrically connected to the second input pad portion.

12. The optical coupler according to claim 11, wherein electrical connections are made with bonding wires.

13. The optical coupler according to claim 12, wherein bonding wires from the first and second input leads to the respective first and second input pad portions each extend in a third direction, and a bonding wire between the light emitting element and the light emitting element pad portion and a bonding wire between the power lead and the power pad portion each extend in a fourth direction that intersects the third direction.

14. The optical coupler according to claim 13, wherein the third and fourth directions are substantially perpendicular to each other.

15. The optical coupler according to claim 10, wherein the inner portion of the first input lead includes an end portion that extends in the first direction towards the second input put lead.

16. The optical coupler according to claim 10, wherein a distance along the first direction from the first die-pad portion to the second die-pad portion is less than a distance along the second direction from the second die-pad portion to each of the first and second input leads.

17. The optical coupler according to claim 10, wherein the first and second input leads have a same length.

18. An optical coupler, comprising:
an optical transmitting unit and an optical receiving unit in a facing arrangement, the optical transmitting unit and the optical receiving unit being encased in a package and having a plurality of leads extending from the package, the optical transmitting unit including:
a light emitting element on a first die-pad portion of a power lead,
a semiconductor element on a second die-pad portion on a ground lead, the first and second die-pad portions being spaced from each other in a first direction,
a first input lead between the power lead and the ground lead in the first direction,
a second input lead between the power lead and the ground lead in the first direction, the first and second input leads being spaced from each other in the first direction and spaced from the second die-pad portion in a second direction crossing the first direction, wherein
the semiconductor element has a power pad portion, a light emitting element pad portion, a first input pad portion, and a second input pad portion thereon,
the power pad portion being electrically connected to power lead via a first bonding wire,
the light emitting element pad portion being electrically connected to the light emitting element via a second bonding wire,
the first input pad portion being electrically connected to the first input lead via a third bonding wire,
the second input pad portion being electrically connected to the second input pad portion via a fourth bonding wire, and
the first and second bonding wires extending a third direction that intersects a fourth direction in which the third and fourth bonding wires extend.

19. The optical coupler according to claim 18, wherein the third and fourth directions are substantially perpendicular to each other.

20. The optical coupler to claim 18, wherein the power pad portion and the light emitting element portion are disposed along an edge of the semiconductor element extending in the second direction, and the first input pad portion and the second input pad portion are disposed along an edge of the semiconductor element extending in the first direction.

* * * * *